United States Patent
Terwilliger

(10) Patent No.: US 8,193,962 B1
(45) Date of Patent: Jun. 5, 2012

(54) HIGH RESOLUTION A/D CONVERSION BASED ON PIECEWISE CONVERSION AT LOWER RESOLUTION

(75) Inventor: Steve Terwilliger, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 64 days.

(21) Appl. No.: 12/835,024

(22) Filed: Jul. 13, 2010

(51) Int. Cl.
*H03M 1/12* (2006.01)
(52) U.S. Cl. ............ 341/156; 341/155; 341/131
(58) Field of Classification Search ............ 341/131, 341/155, 156
See application file for complete search history.

(56) References Cited

U.S. PATENT DOCUMENTS

| 5,245,341 | A | * | 9/1993 | Maeder | 341/131 |
| 5,428,357 | A | * | 6/1995 | Haab et al. | 341/155 |
| 6,614,373 | B1 | * | 9/2003 | Frazier | 341/143 |

OTHER PUBLICATIONS

Data Sheet, MAX104, 8-bit ADC, Maxim Integrated Products, 30 pages, Mar. 2002.
Data Sheet, ICL 7106/7107, 3 ½-bit A/D Converter, Maxim Integrated Products, 12 pages, 1987.
Data Sheet, AD7298, 12-bit SAR ADC, Analog Devices, 18 pages, 2009.

* cited by examiner

*Primary Examiner* — Jean B Jeanglaude
(74) *Attorney, Agent, or Firm* — Scott B. Stahl

(57) ABSTRACT

Piecewise conversion of an analog input signal is performed utilizing a plurality of relatively lower bit resolution A/D conversions. The results of this piecewise conversion are interpreted to achieve a relatively higher bit resolution A/D conversion without sampling frequency penalty.

20 Claims, 2 Drawing Sheets

HIGH RESOLUTION A/D CONVERSION BASED ON PIECEWISE CONVERSION AT LOWER RESOLUTION

This invention was developed under Contract DE-AC04-94AL85000 between Sandia Corporation and the U.S. Department of Energy. The U.S. Government has certain rights in this invention.

FIELD OF THE INVENTION

The invention relates generally to A/D conversion and, more particularly, to increasing resolution in A/D conversion.

BACKGROUND OF THE INVENTION

An analog to digital (A/D) converter converts real world analog signals (e.g., sound) to digital representations that can be used in computers and other digital equipment. Among the several types of conventional ADCs are the parallel or flash converter, the successive approximation converter, and the ramp converter. The higher the resolution of the analog to digital converter (or ADC), and the higher the sampling frequency, the more accurate the resulting digital representation of the analog signal.

It is more challenging to design an ADC with high resolution (i.e., with a relatively larger number of parallel output bits) that will also work at high frequencies than to design a lower resolution ADC (i.e., with a relatively smaller number of parallel output bits) that will work at high frequencies. The particular frequency and resolution limits where problems arise in ADC design often depend on the topology that is employed. Typically, a resolution of 8-10 bits is possible in most IC processes. Resolution higher than 10 bits becomes difficult due to factors such as matching requirements and parasitics.

Some conventional designs, typically Sigma-Delta designs, provide 14-16 bit resolution, but such precision comes at the price of relatively low frequency operation. Sigma Delta converters typically operate at frequencies less than 1 MHz. Flash converters are very fast (e.g., 100 MHz), but get very large for more than 6-8 bits resolution. Some specialized ADCs are conventionally produced by using laser trimming for matching, or by using complex calibration routines with extra circuitry to achieve more than 10 bits resolution. Pipelined ADC architectures can operate at frequencies of 50 Mhz, but usually with 8-10 bits resolution. Ultimately, the tradeoff is typically between speed, resolution, and area.

It is desirable in view of the foregoing to provide for A/D conversion with increased bit resolution without sampling frequency penalty.

DETAILED DESCRIPTION

Exemplary embodiments of the invention perform a piecewise conversion of the analog input signal utilizing a plurality of relatively lower bit resolution A/D conversions. The results of this piecewise conversion are interpreted to achieve a relatively higher bit resolution A/D conversion without sampling frequency penalty. The present work exploits the fact that it is easier to design an N-bit ADC for high sampling frequencies than to design an N+x bit ADC for the same sampling frequencies. Depending on the value of x, an N bit ADC may be both easier to design and capable of higher sampling frequencies than an N+x bit ADC. The desired N+x bit resolution is achieved according to exemplary embodiments of the invention by using a plurality of the N bit ADCs rather than the N+x bit ADC.

Figure 1:
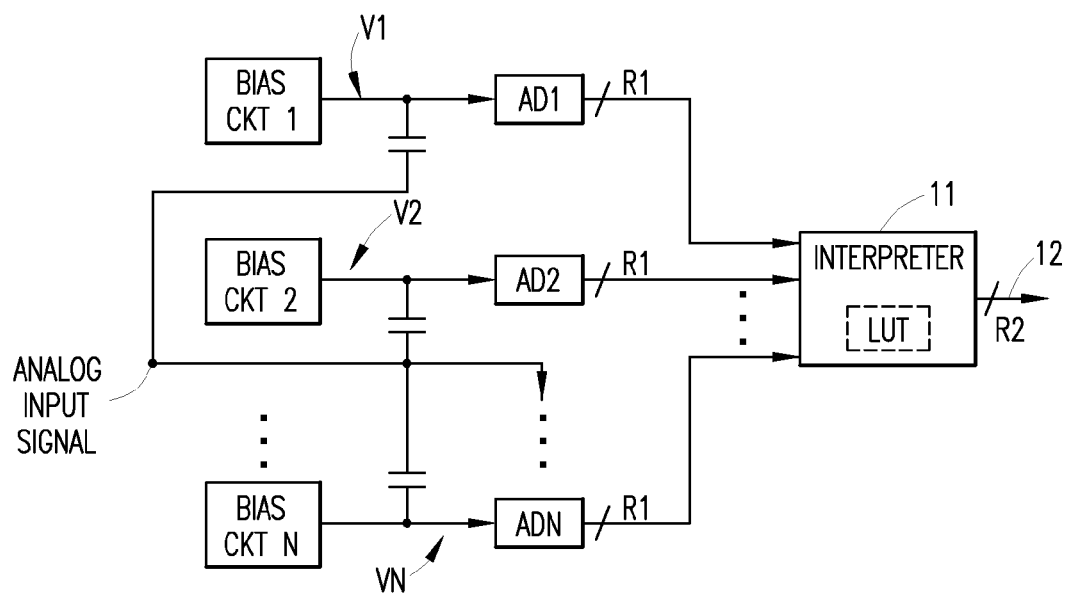
FIG. 1 diagrammatically illustrates an A/D conversion apparatus according to exemplary embodiments of the invention.

FIG. 1 diagrammatically illustrates an A/D conversion apparatus according to exemplary embodiments of the invention. As shown in FIG. 1, an analog input signal is applied in parallel (through respective capacitors as is known in the art) to the inputs of N ADCs, which are designated as AD1, AD2, ... ADN. Also provided are N bias circuits, designated as BIAS CKT 1, BIAS CKT 2, ... BIAS CKT N, which bias the inputs of the respective ADCs to respectively different bias voltages, designated as V1, V2, ... VN. The bias voltages effectively apportion the voltage range of the input signal among the N ADCs. More specifically, the N bias voltages define N portions of the input signal voltage range that are respectively associated with the N ADCs. The ADCs, namely AD1, AD2, ... ADN, therefore perform desired A/D conversions on their respectively associated portions of the input signal voltage range.

Each of the ADCs provides a digital output code that is R1 bits wide, for a bit resolution of R1 bits. An interpreter 11 coupled to the ADCs receives the N digital outputs (each R1 bits wide) produced by the N ADCs, and interprets those outputs to produce a corresponding digital result at 12 that is an A/D conversion of the analog input signal with a resolution of R2 bits, where R2>R1. The interpreter 11 is thus seen to interpret N digital signal components of bit width R1 to produce a composite digital signal 12 of bit width R2. Thus, an A/D conversion of the input signal with resolution of R2 bits is achieved using N ADCs with resolution of R1 bits each.

TABLE 1 below shows an example wherein: N=4, R1=2 and R2=4 in FIG. 1; the analog input is a 16V peak-to-peak signal that ranges from −8V to +8V; and the full scale voltage range of each ADC is 4V. In particular, Table 1 shows the bias voltages for the ADCs, together with the corresponding responses (output bits) of the ADCs to the various portions of the input signal voltage range.

TABLE 1

| ADC | Bias Voltage | OUTPUT BITS vs. INPUT VOLTAGE PORTION | | |
|-----|------|-------------|-------------|-------------|
|     |      | Vary 00 → 11 | 00 | 11 |
| AD1 | −4 V | 4 V to 8 V | −8 V to 4 V | ≧8 V |
| AD2 | 0 V  | 0 V to 4 V | −8 V to 0 V | ≧4 V |
| AD3 | 4 V  | −4 V to 0 V | −8 V to −4 V | ≧0 V |
| AD4 | 8 V  | −8 V to −4 V | ≦−8 V | ≧−4 V |

For example, AD3 is biased to 4V, so its output bits vary from 00 to 11 for input voltages from −4V to 0V. Otherwise, its output bits are 00 for input voltages from −8V to −4V, and 11 for input voltages of 0V or above.

Figure 2:
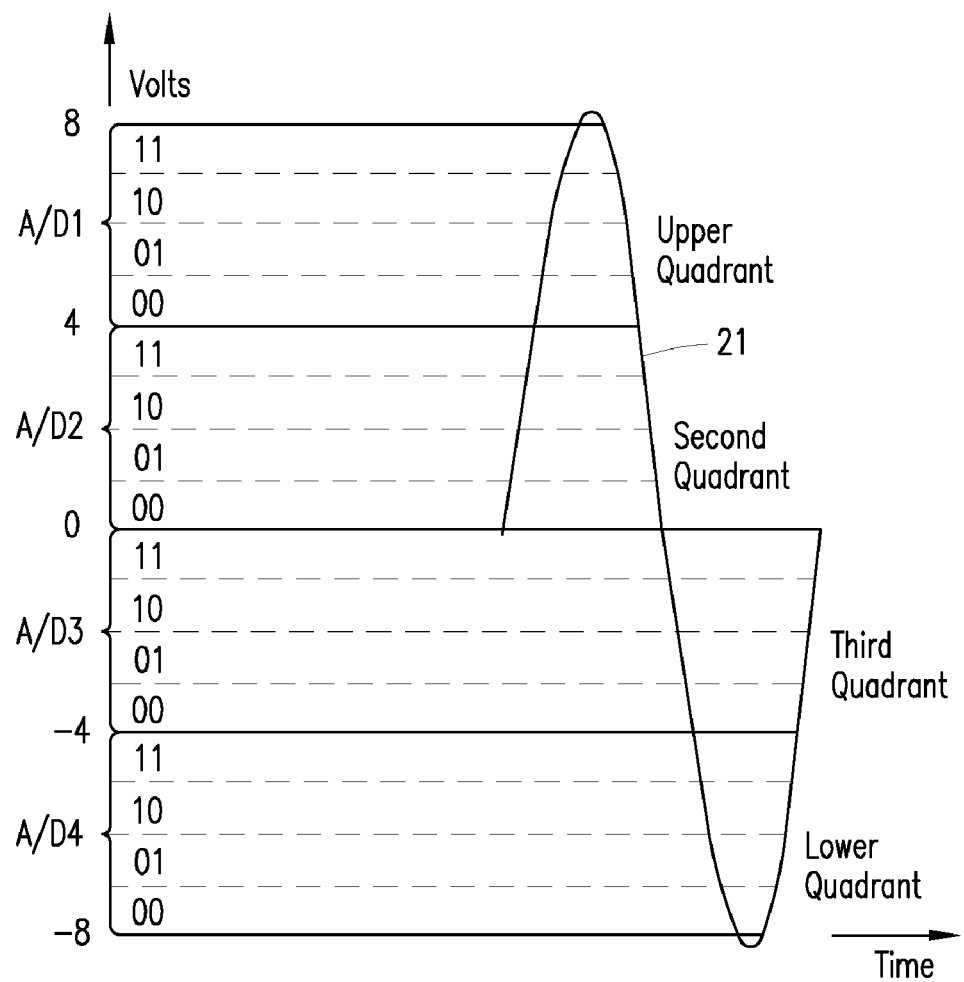
FIG. 2 graphically illustrates an analog input signal, bias voltages for ADCs, and the portions of the input signal voltage range that are apportioned to respective ADCs by the bias voltages.

FIG. 2 graphically illustrates the situation of Table 1, with a 16V peak-to-peak analog input signal 21 that ranges from −8V to +8V, and assuming AD1-AD4 are biased as shown in Table 1. FIG. 2 illustrates which portions of the voltage range of input signal 21 respectively cause the outputs of AD1-AD4 to vary. As shown, the output of AD1 varies only in response to the portion of the voltage range (4V to 8V) designated as the upper quadrant. The output of AD2 varies only in response to the voltage range portion (0V to 4V) designated as the second quadrant. The output of AD3 varies only in response to the voltage range portion (−4V to 0V) designated as the third quadrant. The output of AD4 varies only in response to the voltage range portion (−8V to −4V) designated as the lower quadrant.

Referring again to FIG. 1, in some embodiments, the interpreter 11 inspects the N digital output codes produced by the AD1-ADN, and identifies which ADC among AD1-ADN provides the most significant bit (MSB) with respect to the sampled input voltage. The interpreter then adds the (decimal) value of the digital output code from the identified ADC to the lower voltage of the particular voltage range portion that causes the output of the identified ADC to vary. Using the situation illustrated in Table 1 and FIG. 2 as an example (N=4, R1=2 and R2=4), if the output codes from the ADCs are AD1=AD2=AD3=00, and AD4=01, then AD4 provides the MSB. From Table 1, the lower voltage of the voltage range portion that causes the output of AD4 to vary is −8V. The decimal value of the (binary) code 01 from AD4 is 1, so the interpreter determines the sampled voltage to be −8+1=−7V (see also FIG. 2). As another example, if the output codes from the ADCs are AD1=AD2=AD3=AD4=11, then AD1 provides the MSB. From Table 1, the lower voltage of the voltage range portion that causes the output of AD1 to vary is +4V. The decimal value of the (binary) code 11 from AD1 is 3, so the interpreter determines the sampled voltage to be +4+3=+7V (see also FIG. 2). The −7V and +7V levels from the above examples may be accommodated by the 4 bits (R2=4) provided at 12, using one bit as a sign bit.

More generally, it is evident from the foregoing that a corresponding sampled voltage can be readily determined for all possible combinations of bits that the interpreter 11 may receive from AD1-ADN in FIG. 1. Accordingly, some embodiments of the interpreter 11 employ a look-up table (LUT) whose entries are R2-bit digital values indicative of respectively corresponding voltages sampled from the analog input signal. FIG. 1 shows LUT embodiments in broken line. The N digital output codes currently received from AD1-ADN are the input to the LUT, and the LUT entry that corresponds to this currently received combination of bits is provided at 12 as the R2-bit result.

In general, the number, N, of ADCs with resolution of R1 bits required to produce the resolution of R2 bits at the output 12 in FIG. 1 is $N=2^{(R2-R1)}$. Considering again the example described above relative to TABLE 1 and FIG. 2, when ADCs with resolution of 2 bits (R1=2) are to be used to achieve a 4-bit resolution (R2=4) output, this requires N=4 of the 2-bit ADCs, that is, $N=2^{(4-2)}=4$.

Although exemplary embodiments of the invention are described above in detail, this does not limit the scope of the invention, which can be practiced in a variety of embodiments.

What is claimed is:

1. An analog-to-digital (A/D) conversion method, comprising:
    providing an analog input signal that varies within a voltage range over time;
    associating portions of said voltage range to respectively corresponding A/D conversion operations;
    performing said A/D conversion operations on the respectively corresponding portions to produce respectively corresponding multi-bit digital signal components having a common bit width, wherein each said multi-bit digital signal component varies in accordance with variation of the analog input signal only when the analog input signal occupies the corresponding portion of the voltage range; and
    interpreting said multi-bit digital signal components to produce a composite digital signal that corresponds to the analog input signal and has a further bit width greater than said common bit width.

2. The method of claim 1, wherein said associating includes providing respectively different bias voltages for controlling the respective A/D conversion operations.

3. The method of claim 2, wherein said bias voltages are contained within said voltage range and substantially equally spaced from one another.

4. The method of claim 3, wherein one of said bias voltages is substantially equal to an upper limit of said voltage range.

5. The method of claim 2, wherein one of said bias voltages is substantially equal to an upper limit of said voltage range.

6. The method of claim 1, wherein said multi-bit digital signal components are equal in number to $2^{(R2-R1)}$, and wherein R1 is said common bit width and R2 is said further bit width.

7. The method of claim 6, wherein said associating includes providing respectively different bias voltages for controlling the respective A/D conversion operations.

8. The method of claim 7, wherein said bias voltages are contained within said voltage range and substantially equally spaced from one another.

9. The method of claim 7, wherein one of said bias voltages is substantially equal to an upper limit of said voltage range.

10. The method of claim 1, wherein said interpreting includes applying said multi-bit digital signal components as input to a look-up table.

11. An analog-to-digital (A/D) conversion apparatus, comprising:
    a plurality of A/D conversion circuits arranged to receive an analog input voltage signal that varies within a voltage range over time, said A/D conversion circuits configured to perform respectively corresponding A/D conversion operations on respectively corresponding portions of said voltage range to produce respectively corresponding multi-bit digital signal components having a common bit width, wherein each said multi-bit digital signal component varies in accordance with variation of the analog input signal only when the analog input signal occupies the corresponding portion of the voltage range; and
    an interpreter coupled to said A/D conversion circuits and configured to interpret said multi-bit digital signal components to produce a composite digital signal that corresponds to the analog input signal and has a further bit width greater than said common bit width.

12. The apparatus of claim 11, wherein said A/D conversion circuits each respectively include an A/D converter and a bias circuit coupled to said A/D converter, and wherein said bias circuits provide respectively different bias voltages to the associated A/D converters for controlling the respective A/D conversion operations.

13. The apparatus of claim 12, wherein said bias voltages are contained within said voltage range and substantially equally spaced from one another.

14. The apparatus of claim 13, wherein one of said bias voltages is substantially equal to an upper limit of said voltage range.

15. The apparatus of claim 12, wherein one of said bias voltages is substantially equal to an upper limit of said voltage range.

16. The apparatus of claim 11, wherein said multi-bit digital signal components are equal in number to $2^{(R2-R1)}$, and wherein R1 is said common bit width and R2 is said further bit width.

17. The apparatus of claim 16, wherein said A/D conversion circuits each respectively include an A/D converter and a bias circuit coupled to said A/D converter, and wherein said bias circuits provide respectively different bias voltages to the associated A/D converters for controlling the respective A/D conversion operations.

18. The apparatus of claim 17, wherein said bias voltages are contained within said voltage range and substantially equally spaced from one another.

19. The apparatus of claim 17, wherein one of said bias voltages is substantially equal to an upper limit of said voltage range.

20. The apparatus of claim 11, wherein said interpreter includes a look-up table and is configured to apply said multi-bit digital signal components as input to said look-up table.

\* \* \* \* \*